(12) United States Patent
Ishigaki et al.

(10) Patent No.: US 7,460,189 B2
(45) Date of Patent: Dec. 2, 2008

(54) MANUFACTURING METHOD OF A DISPLAY DEVICE USING A TWO-LAYERED RESIST

(75) Inventors: Toshimasa Ishigaki, Chiba (JP); Masahiro Nishizawa, Mobara (JP); Fumio Takahashi, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 56 days.

(21) Appl. No.: 11/483,094

(22) Filed: Jul. 10, 2006

(65) Prior Publication Data
US 2007/0008442 A1 Jan. 11, 2007

(30) Foreign Application Priority Data
Jul. 11, 2005 (JP) .............................. 2005-201145

(51) Int. Cl.
*G02F 1/136* (2006.01)

(52) U.S. Cl. .............................. 349/42; 257/57; 257/59
(58) Field of Classification Search .................. 349/42; 438/149
See application file for complete search history.

*Primary Examiner*—Matthew Smith
*Assistant Examiner*—Walter H Swanson
(74) *Attorney, Agent, or Firm*—Reed Smith LLP; Stanley P. Fisher, Esq.; Juan Carlos A. Marquez, Esq.

(57) ABSTRACT

The present invention realizes the two-layered resist structure for obtaining a half exposure pattern of high sensitivity and high accuracy and a manufacturing method of a display device which includes thin film transistors which are formed using the two-layered resist. The resist is constituted of five layers, that is, a base film, a cushion layer, an upper-layer resist, a lower-layer resist and a cover film. Thicknesses of these structural members are set such that base film has a thickness of 50 to 100 μm, the cushion layer has a thickness of 10 to 30 μm, the upper-layer resist has a thickness of 0.5 to 1.0 μm, the lower-layer resist has a thickness of 0.5 to 1.0 μm, and the cover film has a thickness of 10 to 30 μm.

6 Claims, 5 Drawing Sheets

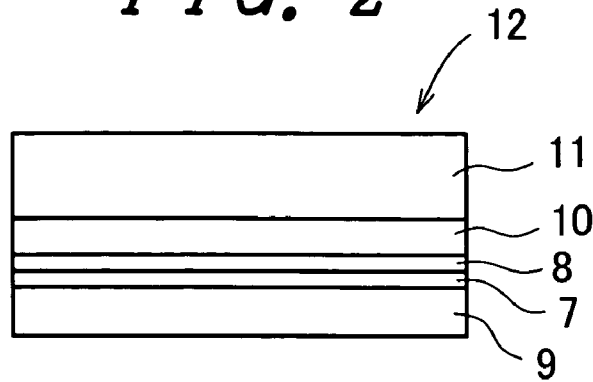
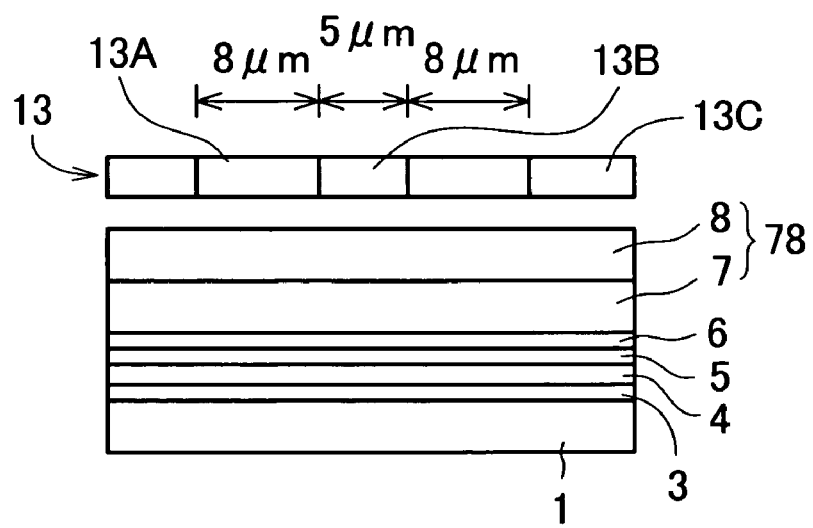
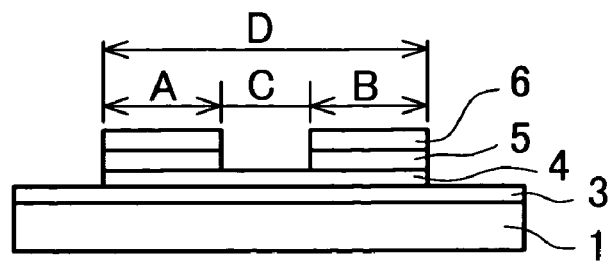

MANUFACTURING METHOD OF A DISPLAY DEVICE USING A TWO-LAYERED RESIST

CROSS-REFERENCE TO RELATED APPLICATIONS

The disclosure of Japanese Patent Application No. 2005-201145 filed on Jul. 11, 2005 including the specification, drawings and abstract is incorporated herein by reference in its entirety.

BACKGROUND OF THE INVENTION

1. Field of the Invention

The present invention relates to a resist which is used in the manufacture of an electronic device such as a thin film transistor and a manufacturing method of a display device which includes an active substrate having thin film transistors which are manufactured using the resist, wherein the present invention is particularly preferably suitable for simplifying manufacturing steps of the active substrate.

2. Description of the Related Arts

An active-matrix type display device, (or an active-matrix type driving-method image display device or simply referred to as a display device) which uses active elements such as thin film transistors as driving elements of pixels which are arranged in a matrix array has been popularly used. In this type of image display device, in many cases, a large number of pixel circuits and drive circuits which are constituted of active elements such as thin film transistors (TFT) or the like which are formed by using a silicon film as a semiconductor film are arranged on an insulating substrate thus displaying images of high quality.

FIG. 7 is a schematic cross-sectional view of an active substrate which explains a constitutional example of a thin film transistor. Here, the explanation is made by taking the thin film transistor of the pixel circuit as an example. The thin film transistor is formed as a non-metallic multi-layered film by stacking, on a main surface of a substrate 1 made of glass or the like, a gate electrode 2, a silicon nitride film 3 which constitutes an insulating layer referred to as a gate insulating film, an a-Si film 4 which constitutes an activation layer, and an n$^+$ a-Si film 5 which is referred to as a contact layer in this order. The n$^+$ a-Si film 5 is separated by way of a channel 16, wherein a source electrode (or a drain electrode) 61 is connected to one side of the n$^+$ a-Si film 5 and a drain electrode (or a source electrode) 62 is connected to another side of the n$^+$ a-Si film 5.

A protective insulating film (a passivation film, a PAS film) 14 is formed on the substrate 1 such that the protective insulating film 14 covers these electrodes 61, 62. Over the protective insulating film 14, a pixel electrode 15 which is connected to the source electrode (or the drain electrode) 61 via a contact hole formed in the protective insulating film 14 is formed. Here, the active substrate which forms a large number of such thin film transistors thereon is adhered to a color filter substrate which is also referred to as a counter substrate, and liquid crystal is sealed between the active substrate and the color filter substrate thus constituting a liquid crystal display device. Although an orientation film which imparts the initial orientation to molecules of the liquid crystal is formed on the pixel electrode 15, the orientation film is omitted from FIG. 7.

When the thin film transistor constitutes the pixel circuit of the liquid crystal display device, a display signal is supplied to the drain electrode 62 from a drain line (a signal line) not shown in the drawing. Due to the selection in response to a selection signal applied to the gate electrode 2 from a gate line (scanning line) not shown in the drawing, the thin film transistor becomes conductive and the pixel electrode 15 which is connected to the source electrode 61 is driven.

FIG. 8A to FIG. 8H are views for explaining essential steps of a conventional method for manufacturing a display device provided with the thin film transistor shown in FIG. 7. FIG. 8A to FIG. 8H show the manufacturing steps of the thin film transistor using so-called half-exposure processing. The manufacturing steps are explained in conjunction with FIG. 8A to FIG. 8H in order. First of all, a gate electrode 2 is formed on an insulating substrate (herein after referred to as a glass substrate) 1. On the surface of the glass substrate, a non-metallic multi-layered film is formed by stacking a silicon nitride (SiN) film 3 which constitutes an insulating layer, an a-Si film 4 which constitutes an active layer and an n$^+$ a-Si film 5 which constitutes a contact layer in order such that these films cover the gate electrode 2. A metal film 6 which forms source and drain electrodes is stacked on the non-metallic multi-layered film. Then, a resist 7 is applied to the insulating substrate 1 such that the metal film 6 is covered with the resist 7 (FIG. 8A).

A so-called half-exposing mask is placed on the resist 7, the halftone exposure is applied to a portion of the resist corresponding to a channel portion of the thin film transistor and the normal exposure is applied to other portions of the resist and, thereafter, the developing is performed. Accordingly, as shown in FIG. 8B, it is possible to form a pattern having a cross-sectional shape in which a portion of the resist 7 indicated by an arrow b1 corresponding to the channel portion has a half film thickness.

When baking is applied to the above-mentioned structure, the resist is melted as shown in FIG. 8C and the resist pattern is collapsed and a profile of the channel portion becomes indefinite. Accordingly, wet etching is applied without performing the baking. As a result, end portions of the metal film 6 covered with the resist 7 are etched back as indicated by arrows d1, d2 (FIG. 8D).

Next, dry etching is applied to the n$^+$ a-Si film 5 and the a-Si film 4 thus forming so-called islands. Here, as indicated by an arrow e1 in FIG. 8E, a film thickness of the resist 7 is also reduced largely (FIG. 8E). Thereafter, by applying oxygen ashing to the resist 7 thus largely reducing the thickness of the resist 7 as indicated by an arrow f1, a portion of the metal film 6 corresponding to the channel is exposed (FIG. 8F).

Then, by applying wet etching, the metal film 6 is divided into the portion constituting the source (or the drain) electrode and the portion constituting the drain (or the source) electrode (FIG. 8G). Here, a separated portion indicated by an arrow g1 and an outer end portion are also further etched back. Further, the n$^+$ a-Si film 5 corresponding to the channel portion is removed by dry etching (FIG. 8H). Thereafter, the thin film transistor is formed through the steps explained in conjunction with FIG. 7. As documents which disclose a prior art relevant to such half exposure, Japanese Patent Laid-Open Hei 09/186233 (document 1) and Japanese Patent Laid-Open No. 324725/2001 (document 2) are named.

As described above, in the manufacturing steps of the display device which forms two kinds of resist patterns from one-layer resist using the half exposure processing, the baking is not performed due to the reason explained in conjunction with FIG. 8C and wet etching is performed and hence, it is impossible to obtain the sufficient adhesion of resist to the metal film. As a result, as shown in FIG. 8D and FIG. 8G, in addition to the formation of the excessive etching back (also referred to as side etching), an etchant is liable to easily intrude into an interface between the resist and the metal film and hence, the metal film is etched undesirably thus giving rise to the irregular shape, the reduction of film thickness and the film thickness irregularities.

On the other hand, Japanese Patent Laid-Open No. 26333/2002 (document 3) discloses a manufacturing method of an active matrix substrate in which patterning can be performed with high accuracy with the use of a two-layered resist which applies a resist having low sensitivity and low developing solubility as a lower layer and a resist having high sensitivity and high developing solubility as an upper layer.

SUMMARY OF THE INVENTION

In the half exposure processing, a resist pattern having different film thicknesses is formed by half tone exposure, a portion of a metal film where a resist is not applied is removed by wet etching or dry etching and, thereafter, the resist and a background metal at a half exposure portion (having a resist film thickness which is approximately half of the resist film thickness in other portions) are removed by wet etching or dry etching thus reducing one photo step.

When the metal film is etched using the resist pattern, the baking is usually applied before etching. In general, when the coating-type resist is applied twice, the number of steps is increased. Further, when the second-layer (upper layer) resist is applied to the first-layer (lower layer) resist, the first-layer resist interferes with the second-layer resist. That is, the first-layer resist is resolved by a solvent of the second-layer resist and hence, it is difficult to form the two-layered film having an accurate film thickness.

In forming the thin film transistors (TFT) on a large-sized substrate, a resist having the sensitivity which is several steps higher than the sensitivity of a resist used for the manufacture of semiconductor integrated circuits is used. Such a resist exhibits a high mixing ratio of a low molecular weight content to increase the sensitivity and hence, the resistance against etching is decreased. Accordingly, in an actual manufacturing method, baking (post-baking) at a temperature of approximately 120° C. to 150° C. is performed thus increasing the resist resistance and, thereafter, the resist is subjected to an etching step.

However, a generally available phenol novolac-based positive resist melts at a temperature of approximately 120.degree. C. and hence, when the baking is performed in the half exposure pattern, a boundary of the half pattern becomes blurred by thermal sagging and hence, the pattern accuracy is lowered by etching whereby it is difficult to stably acquire sizes as designed. Further, when a phenol novolac-based resin having a high sensitivity is used, when the exposure exceeds a fixed exposure quantity, the solubility is no more proportional to the exposure quantity and hence, to acquire the half exposure pattern with high accuracy, it is necessary to use the resist having low exposure sensitivity or it is necessary to perform the exposure for a long time with low illuminance. Whichever method is selected, a throughput time for exposure is largely prolonged compared to usual processing.

The patent document 3 discloses the use of the two-layered resist which applies the resist having low sensitivity and low developing solubility as the lower layer and applies the resist having high sensitivity and high solubility as an upper layer. However, in an actual manufacturing method, the lower-layer resist is dissolved by a solvent of the upper-layer resist and hence, it is difficult to acquire the half exposure pattern with high accuracy. Further, the thermal deformation attributed to post-baking and the etching resistance are not compatible and hence, it is also difficult to stably acquire the sizes as designed.

The present invention has been made in view of the above-mentioned drawbacks of the related art and it is an object of the present invention to realize the two-layered resist structure which can obtain a half exposure pattern having high sensitivity and high accuracy and a manufacturing method of a display device having thin film transistors which are formed by using the two-layered resist.

A resist of the present invention is characterized by adopting the film-like structure having the two-layered-resist all-five-layered structure in which a cushion layer, an upper-layer resist, a lower-layer resist are stacked in order on a base film, and a topmost surface of the lower-layer resist is covered with a cover film. Typically, a polymer-resin molded product is used as the base film, and any one of polyethylene terephthalate, polyester, polystyrene, and cellulose acetate is used as the high polymer resin. Further, a thermoplastic polymer resin having low glass transitional temperature is used as a material of the cushion layer, wherein the thermoplastic polymer resin is formed of any one of ethylene, (metha)acrylic acid ester, and unsaturated alkylether.

Further, the sensitivity of the upper-layer resist is set higher than the sensitivity of the lower-layer resist. That is, the upper-layer resist may possess a thermal crosslinking system, a molecular weight of the upper-layer resist may be set larger than a molecular weight of the lower-layer resist, or the upper-layer resist may possess a thermal crosslinking system and, at the same time, set a molecular weight thereof larger than a molecular weight of the lower-layer resist. The resist may be of a phenol novolac type or a chemically amplified type.

A polymer resin product is used as a cover film, wherein any one of polypropylene, polyester, polytetrafluoroetylene is used as a material of the cover film.

Further, in a manufacturing method of the display device of the present invention, a stacked film which is a thin film transistor constituting material is formed on an insulating substrate, a two-layered resist is transferred to the stacked film, a two-layered resist is patterned using a half exposure mask, and, after baking, patterning is applied to the stacked film from a metal film which constitutes an upper layer of the stacked film by etching. Typical steps may include:

a stacked film forming step in which a stacked film which is a thin film transistor constituting material is formed on the insulating substrate, wherein the stacked film is formed by forming a non-metal multi-layered film by stacking a silicon nitride film which constitutes an insulating layer, an a-Si film which constitutes an activation layer and an $n^+$ a-Si film which constitutes a contact layer in order on the insulating substrate and by stacking a metal film which becomes source and drain electrodes on the non-metal multi-layered film;

a two-layered resist transfer step in which a film-like two-layered resist having the five-layered structure which is formed by stacking a cushion layer, an upper-layer resist and a lower-layer resist on a base film in this order and forming a cover film on a topmost surface of the lower-layer resist and sets the sensitivity of the upper-layer resist thereof higher than the sensitivity of the lower-layer resist is transferred onto the stacked film;

a two-layered resist patterning step in which the upper-layer resist and the lower-layer resist of the two-layer film-like resist are exposed using a half exposure mask and are developed thus forming predetermined resist patterns on the respective upper-layer resist and lower-layer resist;

a resist baking step in which thermal crosslinking is applied to the upper-layer resist and, at the same time, the lower-layer resist is softened so as to enhance the adhesion thereof with the stacked film;

a metal film patterning step in which the metal film which is exposed from the pattern of the lower-layer resist is removed;

a non-metal multi-layered film patterning step in which the non-metal multi-layered film which is exposed from the pattern of the lower-layer resist is removed;

a lower-layer resist patterning step in which the lower-layer resist is removed with the pattern of the upper-layer resist by oxygen ashing;

a channel portion metal film removing step in which the metal film in a channel portion of the thin film transistor is removed with the pattern of the lower-layer resist thus separating a source electrode and a drain electrode; and an $n^+$ a-Si film patterning step in which the contact film which is exposed in the channel portion metal film removing step is removed.

Here, wet etching is used in the metal film patterning step and the channel portion metal film removing step, while dry etching is used in the non-metal multi-layered film patterning and the $n^+$ a-Si film patterning step.

Further, the two-layered resist of the present invention may be formed such that a coating-type resist is formed by spin coating or slit coating as a first layer, and a film-like resist is formed on the first layer as a second layer by transferring.

Here, it is needless to say that the present invention is not limited to the above-mentioned constitutions and constitutions which are described in the detailed explanation of the invention described later and various modifications are conceivable without departing from the technical concept of the present invention described in claims.

With the use of the resist film of the present invention, the coating step of the resist may be completed by one transfer step and hence, there is no interference between the upper-layer resist and the lower-layer resist whereby it is possible to obtain the half exposure pattern with high size accuracy within the exposure time equal to the exposure time of the conventional manufacturing method. Due to the provision of the manufacturing method of the present invention, the thin film transistors can be formed with high accuracy thus realizing the manufacture of a highly reliable display device.

BRIEF DESCRIPTION OF THE DRAWINGS

FIG. 2 is a cross-sectional view of a film-like resist having the five-layered structure which constitutes a two-layered resist of the present invention;

FIG. 3 is an explanatory view of a half-exposure step which explains the manufacturing method of a display device of the present invention;

FIG. 4 is an explanatory view of sizes of an essential part of the structure of the thin film transistor which is formed by half exposure;

DETAILED DESCRIPTION OF THE INVENTION

The present invention is explained in detail in conjunction with an embodiment herein after using drawings showing the embodiment. Here, as a semiconductor thin film which constitutes an active layer of a thin-film transistor, the use of amorphous silicon (a-Si) is mainly assumed. However, the use of a thin-film material such as polysilicon (p-Si), Ge, SiGe, a compound semiconductor, chalcogenide or the like brings about same effects. In the following embodiment, the explanation is made with respect to a case in which the semiconductor thin film is made of silicon which is generally used. Further, the present invention is not limited to the modification of an amorphous semiconductor film or a polycrystalline semiconductor film which is formed on an insulating substrate made of glass or the like for an image display device. That is, the present invention is also applicable in the same manner to the modification of a similar semiconductor film which is formed on other substrates, for example, a plastic substrate or a silicon wafer.

Figure 1A:
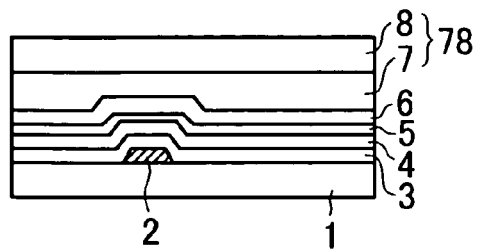
FIG. 1A to FIG. 1H are views for explaining essential steps of a manufacturing method of a display device of the present invention which manufactures a display device provided with thin film transistors shown in FIG. 7.
Figure 7:
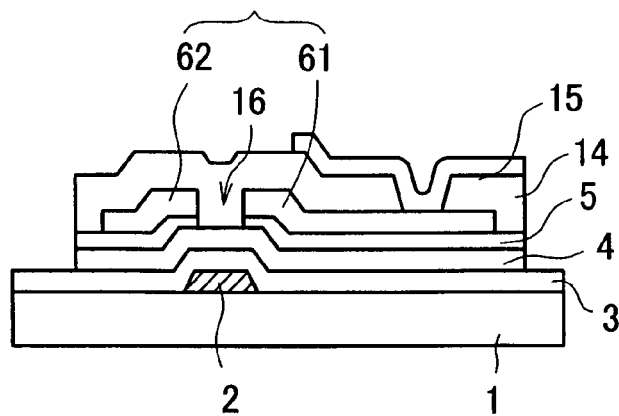
FIG. 7 is a schematic cross-sectional view of an active substrate which explains a constitutional example of a thin film transistor.
Figure 8A:
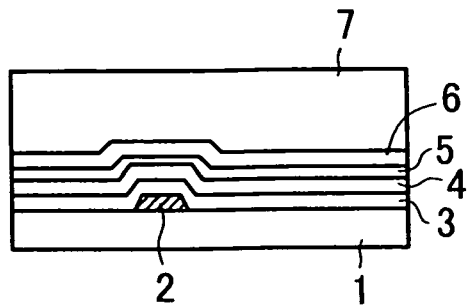
FIG. 8A to FIG. 8H are views for explaining essential steps of a conventional method for manufacturing a display device provided with the thin film transistor shown in FIG. 7.
Figure 8E:
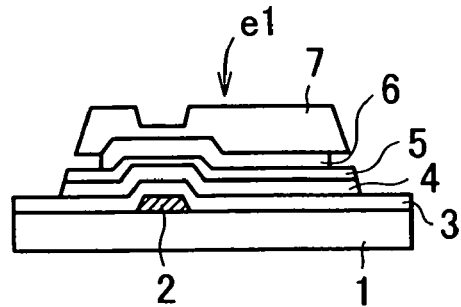
Figure 8B:
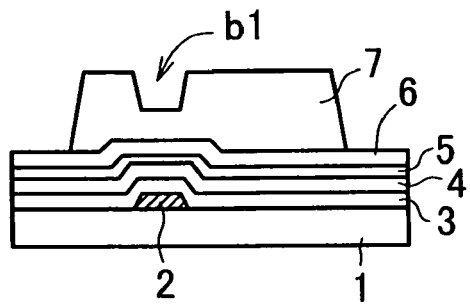
Figure 8F:
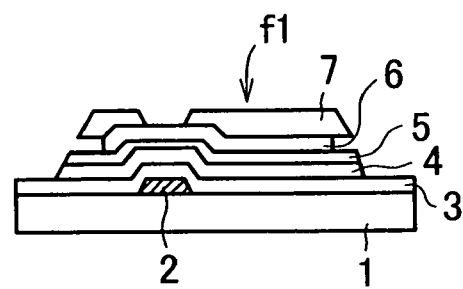
Figure 8C:
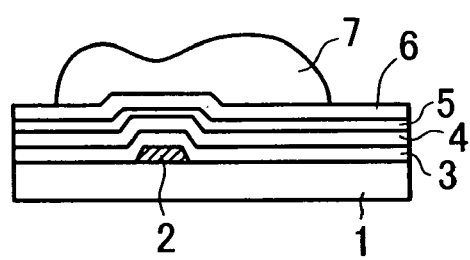
Figure 8G:
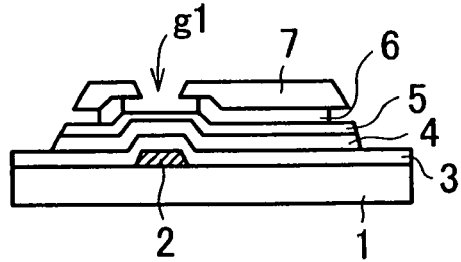
Figure 8D:
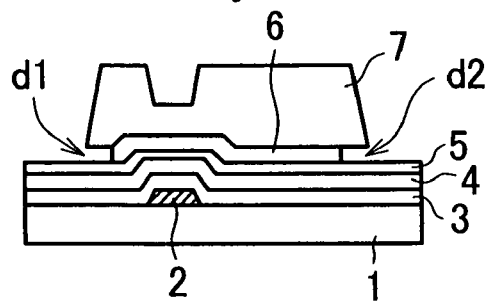
Figure 8H:
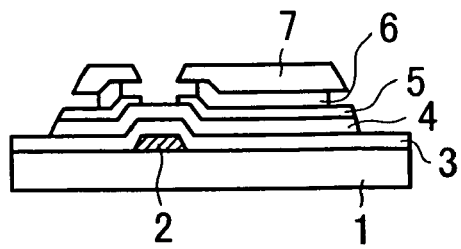

FIG. 1A to FIG. 1H are explanatory views of essential steps of a method of the present invention for manufacturing a display device provided with thin film transistors shown in FIG. 7. FIG. 1A to FIG. 1H show a manufacturing steps of the thin film transistor using so-called half-exposure processing which is also used in steps shown in FIG. 8A to FIG. 8H. The manufacturing steps are explained in conjunction with FIG. 1A to FIG. 1H in order. First of all, a gate electrode 2 is formed on an insulating substrate (herein after referred to as a glass substrate) 1. On the gate electrode 2, a non-metallic multi-layered film which is formed by stacking a silicon nitride (SiN) film 3 which constitutes an insulating layer, an a-Si film 4 which constitutes an active layer and an $n^+$ a-Si film 5 which constitutes a contact layer in order is formed. A metal film 6 which becomes source and drain electrodes is stacked on the non-metallic multi-layered film. Then, a two-layered resist 78 which is formed of a lower-layer resist 7 and an upper-layer resist 8 is transferred to the non-metallic multi-layered film such that the two-layered resist 78 covers the metal film 6 (FIG. 1A).

Figure 1E:
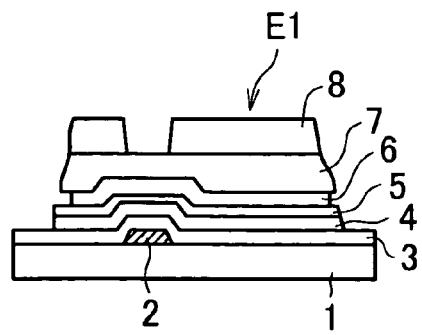
Figure 1B:
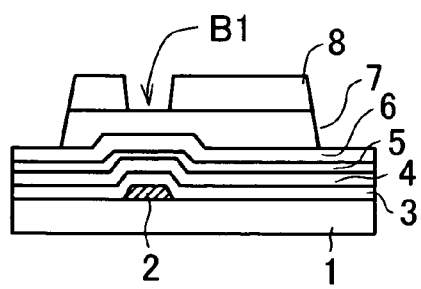

A so-called half-exposing mask is placed on the two-layered resist 78, the halftone exposure is applied to a portion of the upper-layer resist 8 of the two-layered resist 78 corresponding to a channel portion of the thin film transistor, and the normal exposure is applied to other portions of the two-layered resist 78 and, thereafter, the developing is performed. Accordingly, as shown in FIG. 1B, it is possible to form a pattern having a cross-sectional shape in which a portion of the upper-layer resist 8 indicated by an arrow B1 corresponding to the channel portion has a half film thickness.

Figure 1F:
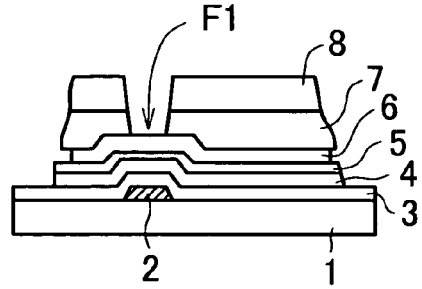
Figure 1C:
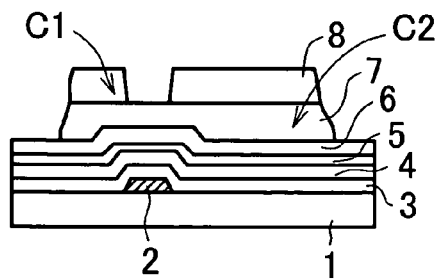

By applying the baking (post-baking) to the two-layered resist 78, as indicated by C1 in FIG. 1C, the pattern shape of the upper-layer resist 8 is maintained by applying thermal crosslinking to the upper-layer resist 8 and, at the same time, as shown in FIG. 1, C2, by melting and softening the lower-layer resist 7, the adhesiveness of the lower-layer resist 7 with the metal film 6 is enhanced. Thereafter, wet etching is applied to the two-layered resist 78. Accordingly, as indicated by arrows D1 and D2 in FIG. 1, edge portions of the metal film 6 covered with the resist 7 are etched back (side etching).

Figure 1G:
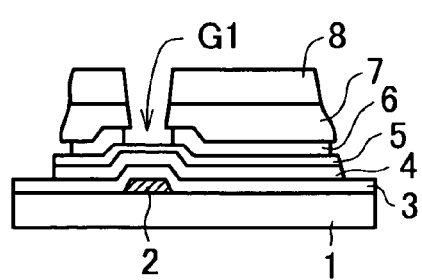
Figure 1D:
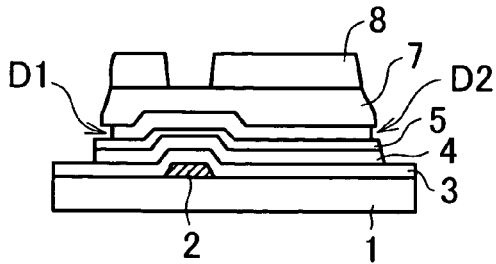

However, an etching quantity is smaller than a corresponding etching quantity in the conventional method explained in conjunction with FIG. 8 (FIG. 1D).

Next, dry etching is applied to the n+ a-Si film 5 and the a-Si film 4 thus forming so-called islands. Here, as indicated by an arrow E1 in FIG. 1, a film thickness of the upper-layer resist 8 is also reduced slightly. However, as the upper-layer resist 8 is hardened by the thermal crosslinking, a reduced quantity of the thickness is smaller than a corresponding reduced quantity of thickness in the conventional method (FIG. 1E). Thereafter, by applying oxygen ashing to the two-layered resist 78, as indicated by an arrow F1 in FIG. 1, the lower-layer resist 7 is removed thus exposing a portion of the metal film 6 corresponding to the channel of the thin film transistor (FIG. 1F). Here, although ashing is also slightly applied to the upper-layer resist 8, a quantity of ashing is smaller than a corresponding quantity of ashing in the conventional method due to the same reason set forth above.

Figure 1H:
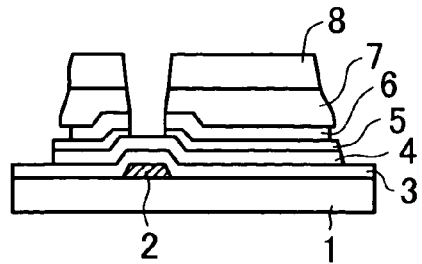

Then, by applying wet etching, the metal film 6 is divided into a portion for forming the source (or the drain) electrode and a portion for forming the drain (or the source) electrode (FIG. 1G). Here, although a separated portion indicated by an arrow G1 and an outer end portion are also etched back, since the lower-layer resist 7 exhibits the favorable adhesion, the etching-back quantity is small. Further, the $n^+$ a-Si film 5 of the channel portion is removed by dry etching (FIG. 1H). Thereafter, the thin film transistor is constituted through the steps explained in conjunction with FIG. 7.

Due to the above-mentioned manufacturing steps using the two-layered resist of the present invention, it is possible to obtain the half exposure pattern of high accuracy with high size accuracy within exposure time substantially equal to the exposure time of the conventional manufacturing method of the display device thus enabling the formation of the thin film transistor with high accuracy whereby the highly reliable display device can be manufactured.

FIG. 2 is a cross-sectional view of the film-like resist of the present invention having the five-layered structure which constitutes the two-layered resist. The film-like resist 12 is constituted of five layers, that is, a base film 11, a cushion layer 10, an upper-layer resist 8, a lower-layer resist 7 and a cover film 9. Thicknesses of these structural members are as follows.

base film 11 . . . 50 to 100 µm cushion layer 10 . . . 10 to 30 µm upper-layer resist 8 . . . 0.5 to 1.0 µm lower-layer resist 7 . . . 0.5 to 1.0 µm cover film 9 . . . 10 to 30 µm Here, these sizes are described merely as an example.

The base film 11 is a polymer-resin molded product and may be made of any one of polyethylene terephthalate, polyester, polystyrene and cellulose acetate.

The cushion layer 10 is made of a thermoplastic polymer resin having a low glass transition temperature. That is, the cushion layer 10 may be made of any one of ethylene, (metha) acrylic acid ester and unsaturated alkylether.

The upper-layer resist 8 is given a property which sets the sensitivity of the upper-layer resist 8 higher than the sensitivity of the lower-layer resist 7. To impart such a property to the upper-layer resist 8, the upper-layer resist 8 may have a thermal cross-linking system, may have a molecular weight larger than a molecular weight of the lower-layer resist 7, or may have a thermal cross-linking system and, at the same time, may have a molecular weight larger than a molecular weight of the lower-layer resist. The resist may be a phenol novolac type resist (positive type) or a chemically amplified type resist. The phenol novolac type resist may be formed by adding naphthoquinone diazido and an alkoxy urea resin, an epoxy resin or the like as a crosslinking agent to a phenol novolac resin.

To increase the sensitivity of the resist, it is possible to adopt a technique such as (1) a technique which mixes a low-molecular-weight novolac to the phenol novolac resin, (2) a technique which sets a molecular weight of the phenol novolac resin to a small quantity, or (3) a technique which increases a ratio of metacresol to the phenol novolac resin.

As the crosslinking agent, a urea resin containing a plurality of alkoxy groups having a molecular weight of equal to or less than 1000 or an epoxy resin containing a plurality of epoxy groups having a molecular weight of equal to or less than 1000 may be used. By imparting a temperature of approximately 150° C. to the upper-layer resist 8 by baking, the resist is cross-linked with a hydroxyl group (—OH) in the phenol novolac resin thus enhancing the heat resistance and the dry etching resistance of the upper-layer resist 8.

The chemically amplified type resist (positive type) is a resist which is produced by adding a photoacid generator and a crosslinking agent (an alkoxy urea-formaldehyde resin, an epoxy resin or the like) to a phenol novolac resin or a poly-hydroxystyrene resin which has a hydroxyl group thereof masked with a protecting group, wherein the chemically amplified type resist has a mechanism in which an acid which is produced by the decomposition of the photoacid generator removes the protecting group which masks the hydroxyl group so that the chemically amplified type resist exhibits the developing solubility. This chemically amplified type resist has the high transparency and the photoacid functions as a photocatalyst and hence, the chemically amplified type resist exhibits the higher sensitivity than the general phenol novolac resin.

Further, the cover film may be a polymer resin product and may be made of any one of polypropylene, polyethylene, polyester, polytetrafluoroethylene.

A cover film 9 of the film-like resist having the five-layered structure is peeled off and is adhered to the topmost metal film stacked on the substrate and the base film 11 is peeled off together with the cushion layer 10 thus forming the two-layered resist.

Here, the chemically amplified type resist has the property that the resist sharply exhibits the developing solubility when a light quantity exceeds a certain quantity and hence, it is difficult to form the half exposure pattern of high accuracy different from the phenol novolac type resist which can obtain the developing solubility which corresponds to the light quantity. Also with respect to the phenol novolac type resist, when the light quantity exceeds a fixed light quantity, a contrast of the developing solubility sharply decreases and hence, it is desirable to perform the exposure spending a time with low illuminance to obtain the half exposure pattern of high accuracy. According to the present invention, with the use of the phenol novolac type resist which exhibits the high sensitivity as the low-layer resist and the chemically amplified type resist which exhibits the higher sensitivity as the upper-layer resist, it is possible to obtain the half exposure pattern of high accuracy within a short exposure time and hence, the throughput of the exposure step is largely enhanced.

FIG. 3 is an explanatory view of a half-exposure step which explains the manufacturing method of a display device of the present invention. In FIG. 3, in the same manner as FIG. 1A, on an insulating substrate 1, the non-metallic multi-layered film which is formed by stacking the silicon nitride (SiN) film 3, the a-Si film 4 which constitutes an active layer and the n+ a-Si film 5 which constitutes a contact layer in order and, on the non-metallic multi-layered film, the metal film 6 which forms the source and drain electrodes is stacked. In FIG. 2, the illustration of gate electrode is omitted. Here, the metal film 6 is made of aluminum. The metal film 6 is covered with the five-layered structure resist film which is explained in FIG. 2, and the two-layered resist 78 formed of the lower-layer resist 7 and the upper-layer resist 8 is transferred to the five-layered structure.

By arranging a half exposure mask 13 on the transferred two-layered resist 78, an exposure is performed. The half exposure mask 13 includes an opaque portion 13A, a semi-transmitting portion 13B and transmitting portions 13C. Thickness of the semi-transmitting portion 13B is set to 5 μm corresponding to a width of a channel portion of the thin film transistor, and the thickness of the transmitting portions 13C which are arranged on both sides of the semi-transmitting portion 13B in a sandwiched manner is set to 8 μm respectively corresponding to portions where the metal film 6 are left as a source and a drain. Further, the transmitting portions 13C are portions for forming islands in the semiconductor. Here, the above-mentioned values are merely examples. FIG. 1B shows a state in which the exposure is performed using the half exposure mask 13, and the developed state.

FIG. 4 is an explanatory view of sizes of an essential part of the structure of the thin film transistor which is formed by half exposure. In FIG. 4, size 1 indicates a width of the source or the drain electrode which is formed of the metal film 6 and is expressed as size 1=(A+b)/2. Size 2 is a width of a removal portion of the contact portion 5 which forms a channel portion, and size 2 is expressed as C. Size 3 is a width of the a-Si film and is expressed as size 3=D. Table 1 shows a result of comparison between embodiments of the present invention and the conventional manufacturing method with respect to the structure of the thin film transistor shown in FIG. 4.

Table 1 shows, with respect to the embodiment 1, the embodiment 2 and the comparison examples 1 to 4, the structure (material), a film forming method and a film thickness of a first-layer (lower-layer) resist and a second-layer (upper-layer) resist, the number of transfer of the resist, the condition of exposure, the presence or the non-presence of post-baking, the temperature and the time when the post-baking is present and the finished size (wiring size).

As shown in Table 1, the wiring sizes of the embodiments 1, 2 exhibit favorable values which fall within ranges of designed values ±10%. Here, the comparison example 1 in which only the upper-layer is formed by the transfer of the resist film also exhibits favorable values. Since the post baking is not performed in the comparison example 2, a side etching quantity of a portion of the metal film is large, the size 1 of the portion of the metal film is largely decreased. Although the comparison example 3 is prepared with the specification which adds post baking to the comparison example 1, a boundary between a full pattern (transmitting portion) and a half pattern (semi-transmitting portion) becomes blurred due to thermal sagging and hence, the size 2 is largely decreased. Although the comparison example 4 is a case in which the two-layered resist film is formed by spin coating, when the second-layer resist is applied, the first-layer resist is dissolved by a solvent of the second-layer resist and hence, desired film thicknesses (each layer: 0.7 μm) cannot be obtained. Accordingly, compared to the comparison example 2 in which the half exposure pattern is formed with one-layered resist spending a reasonable time, the irregularities of the wiring size are increased.

In this manner, with the use of the resist film of the present invention, it is possible to obtain the favorable pattern and hence, it is possible to obtain the half exposure pattern having high accuracy with high size accuracy within the exposure time substantially equal to the exposure time of the conventional manufacturing method. Due to the provision of the

TABLE 1

| | | embodiment 1 | embodiment 2 | comparison example 1 | comparison example 2 | comparison example 3 | comparison example 4 |
|---|---|---|---|---|---|---|---|
| first layer resist | structure | novolac 1 | novolac 1 | novolac 2 | novolac 1 | novolac 1 | novolac 1 |
| | film forming | film transfer | film transfer | spin coating | spin coating | spin coating | spin coating |
| | film thickness | 0.7 μm | 0.7 μm | 0.7 μm | 1.4 μm | 1.4 μm | 0.5 μm |
| second layer resist | structure | novolac 3 | chemically amplified | chemically amplified | — | — | novolac 2 |
| | film forming | film transfer | film transfer | film transfer | — | — | spin coating |
| | film thickness | 0.7 μm | 0.7 μm | 0.7 μm | — | — | 0.5 μm |
| number of transferring | | two layer at a time | one layer at two times | one layer at a time | — | — | — |
| exposure | illuminance | 2 mW/cm2 | 2 mW/cm2 | 2 mW/cm2 | 1 mW/cm2 | 1 mW/cm2 | 2 mW/cm2 |
| | time | 20 seconds | 20 seconds | 10 seconds | 40 seconds | 40 seconds | 20 seconds |
| post-baking | | 150° C./2 minutes | 150° C./2 minutes | 150° C./2 minutes | nothing | 130° C./2 minutes | nothing |
| wiring size | size 1 | 7.4 μm | 7.3 μm | 7.4 μm | 6.4 μm | 8.5 μm | 6.3 μm |
| | size 2 | 5.4 μm | 5.2 μm | 5.2 μm | 5.4 μm | 3.2 μm | 6.0 μm |
| | size 3 | 20.5 μm | 20.8 μm | 21.2 μm | 19.6 μm | 20.6 μm | 18.7 μm |

Note 1) design values: size 1 = 8 μm, size 2 = 5 μm, size 3 = 21 μm
Note 2) novolac 1: sensitivity 40 mJ/cm², novolac 2: sensitivity 20 mJ/cm², novolac 3: sensitivity 40 mJ/cm², thermally crosslinking system added In Table 1, design values of sizes shown in FIG. 4 are set such that size 1=8 μm, size 2=5 μm and size 3=21 μm. Further, in Table 1, novolac 1 has the sensitivity of 40 mJ/cm², novolac 2 has sensitivity of 20 ml/cm², and novolac 3 has the sensitivity of 40 mJ/cm² and a thermally crosslinking system is applied to the novolac 3.

manufacturing method of the present invention, it is possible to form the thin film transistors with high accuracy thus enabling the manufacture of the highly reliable display device.

It is needless to say that the two-layered resist of the present invention is not limited to the above-mentioned embodiments and, for example, the two-layered resist of the present invention is applicable to the formation of the background irregularities at a pixel device portions of a reflection type liquid crystal panel or a semi-transmitting reflection type liquid crystal panel which uses the same half exposure. Here, with respect to the two-layered resist used for the formation of the irregularities, without adopting the thermal crosslinking system to the second-layer resist, thermal sagging is formed by post baking thus forming an initial rectangular pattern into a broad elliptical pattern whereby the favorable reflection property can be obtained.

Further, the two-layered resist of the present invention is formed not only by the above-mentioned etching process but also by the combination of the etching process and a so-called direct drawing method which performs the direct exposure of the pattern without interposing the half exposure mask, for example. Further, it may be possible that one (preferably upper-layer resist) of the two-layered resist is patterned by direct drawing and another (preferably lower-layer resist) of the two-layered resist is patterned by wet or dry etching. That is, various combinations are possible including the combination in which the half pattern is formed on the upper-layer resist by direct drawing and islands of the semiconductor are formed by dry etching or the combination in which the half exposure is performed using the exposure mask and the islands of the semiconductor are formed by direct drawing.

As an example, one of the two-layered resist is patterned by direct drawing thus forming a desired pattern (a first patterning step), and another of the two-layered resist is patterned using the exposure mask (a second patterning step) thus forming a desired pattern. Then, the resist baking is performed so as to apply the thermal crosslinking to the upper-layer resist and, at the same time, to soften the lower-layer resist thus enhancing the adhesion of the lower-layer resist with the stacked film.

Thereafter, the metal film which is exposed from the pattern of the lower-layer resist is removed, the non-metallic multi-layered film which is exposed from the pattern of the lower-layer resist is removed, the lower-layer resist is removed with the pattern of the upper-layer resist by oxygen ashing, and the metal film at the channel portion of the thin film transistor is removed with the pattern of the lower-layer resist thus forming the source electrode and the drain electrode which are separated from each other. Then, by removing the exposed contact film, the essential part of the thin film transistor is formed. Here, since the direct drawing method is known, the explanation of the method is omitted.

Here, the chemically amplified type resist is developed for obtaining an ultra fine pattern on the semiconductor. Since it is basically impossible to perform the ultra fine forming by wet etching, only dry etching which exhibits high forming accuracy becomes a subject of the process resistance. To maintain a longitudinally elongated pattern shape and, at the same time, to increase the dry etching resistance, a molecular weight of a resin which constitutes a base is set to a more or less high value and a thermal crosslinking system is adopted. However, these provisions become factors which lower the wet etching resistance to the contrary (The adhesion is lowered and hence, pattern is peeled or the side etching quantity is increased).

With respect to the thin film transistor substrate for the display device which uses the large-sized substrate, wet etching is popularly used from a view point of productivity and hence, the magnitude of the wet etching resistance is an important matter. According to the two-layered resist of the present invention, by using novolac in the background, it is possible to largely enhance the wet etching resistance which has been a defect of the chemically amplified type resist. In using the chemically amplified type resist in the photolithography step which requires the high definition, it is possible to overcome the lowering of the wet etching resistance which is a defect of the chemically amplified type resist while acquiring the high sensitivity and the high resolution which are advantages of the chemically amplified type resist.

Figure 5:
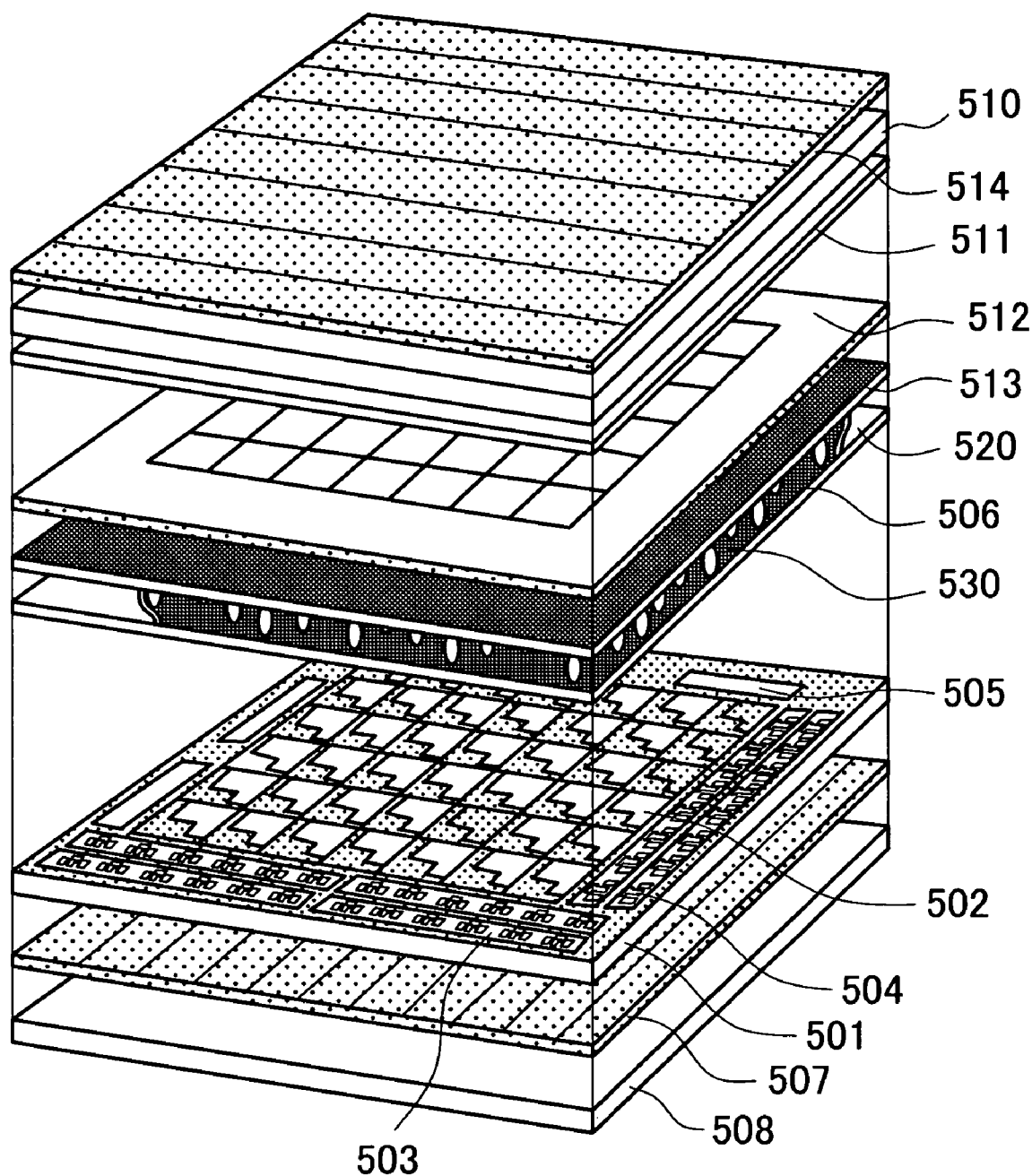
FIG. 5 is a schematic view for explaining a constitutional example which applies the present invention to a liquid crystal display device.

FIG. 5 is a schematic view for explaining a constitutional example which applies the present invention to a liquid crystal display device. On a glass substrate 501, a plurality of pixel electrodes 502 which are arranged in a matrix array, circuits 503 and 504 which input display signals to the pixel electrodes 502, and a group of other peripheral circuits 505 necessary for an image display are formed and, thereafter, an orientation film 506 is applied to the glass substrate 501 by a printing method thus forming an active matrix substrate (thin film transistor substrate).

On the other hand, a color filter substrate is prepared by applying a counter electrode 511, color filters 512 and an orientation film 513 to a glass substrate 510 in the same manner, and the color filter substrate is adhered to the active matrix substrate. Liquid crystal 530 is filled between the opposing orientation films 506, 513 by vacuum injection and the liquid crystal is sealed by a sealing agent 520. Thereafter, polarizers 507, 514 are respectively adhered to outer surfaces of the glass substrate 501 and the glass substrate 510. Then, a backlight 508 is arranged on a back surface of the active matrix substrate thus completing a liquid crystal display device.

Figure 6:
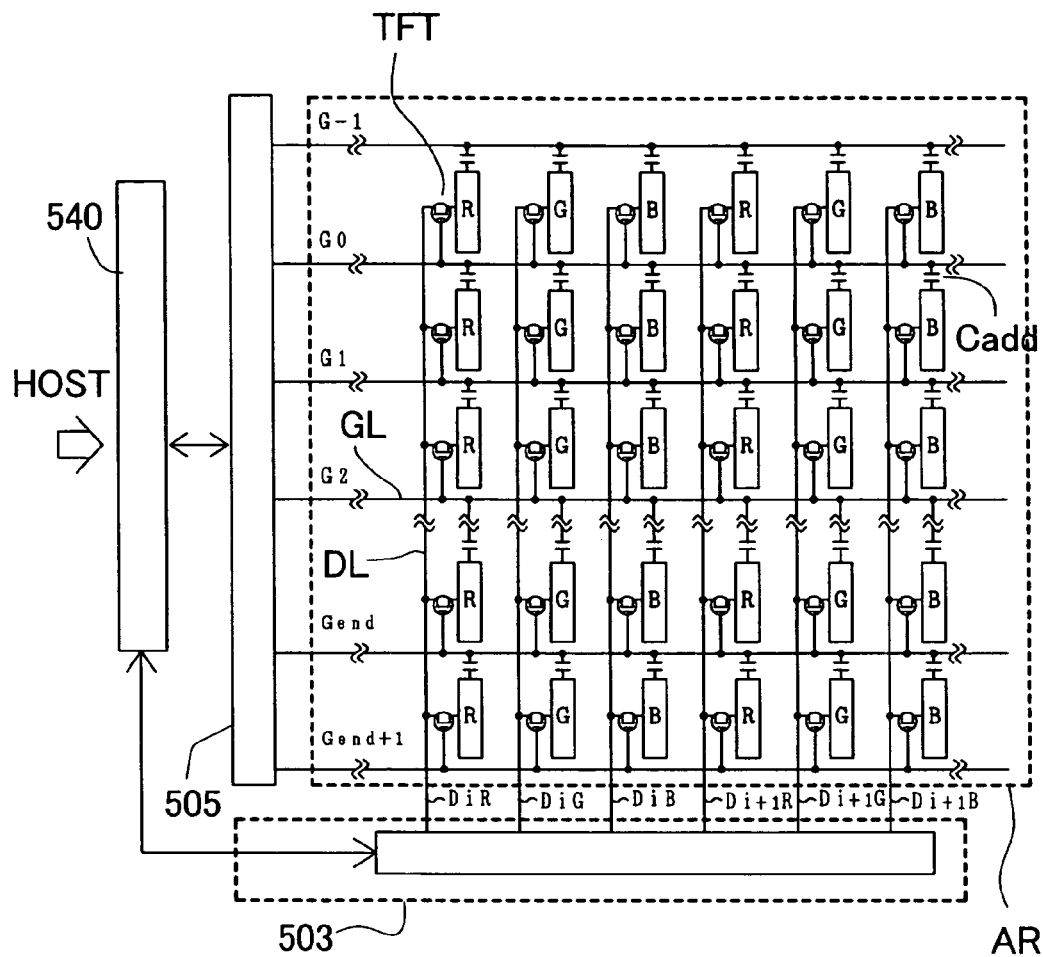
FIG. 6 is an equivalent circuit diagram of the liquid crystal display device shown in FIG. 5.

FIG. 6 is an equivalent circuit diagram of the liquid crystal display device shown in FIG. 5. In a display region indicated by AR in the drawing, a large number of pixels each of which is constituted of a thin film transistor TFT of the present invention are arranged in a matrix array. Symbols R, G, B indicate pixels of red, green and blue each of which is constituted of a liquid crystal element. The pixels are connected to one of scanning lines GL(G−1, G, G2, . . . Gend, Gend+1) which extend from the scanning line drive circuit 505 via an additional capacity Cadd, while gates of the thin film transistors TFTs are connected with another scanning line.

The display signals (display data) are supplied to sources (or drains) of the thin film transistors TFTs which constitute the respective pixels via signal lines DL(DiR, DiG, DiB, . . . Di+1R, Di+1G, Di+1B, . . . ) extending from the signal line drive circuit 503. Various signals and voltages for display are applied to the scanning line drive circuit 505 and the signal line drive circuit 503 from the power source part and controller part 540. Predetermined signals and the like are supplied to the power source part and controller part 540 from an external signal source HOST not shown in the drawing.

What is claimed is:

1. A manufacturing method of a display device comprising:
a stacked film forming step of forming a stacked film which is a thin film transistor constituting material on an insulating substrate, wherein the stacked film is formed by forming a non-metal multi-layered film by stacking a silicon nitride film which constitutes an insulating layer, an a-Si film which constitutes an activation layer and an n$^+$ a-Si film which constitutes a contact layer in order on the insulating substrate and by stacking a metal film which becomes source and drain electrodes on the non-metal multi-layered film;
a two-layered resist transfer step of transferring a film-like two-layered resist onto the stacked film, the film-like two layered resist having a five-layered structure which is formed by stacking a cushion layer, an upper-layer resist and a lower-layer resist on a base film in this order and forming a cover film on a topmost surface of the lower-layer resist and sets sensitivity of the upper-layer resist thereof higher than sensitivity of the lower-layer resist;

a two-layered resist patterning step of exposing the upper-layer resist and the lower-layer resist of the two-layer film-like resist using a half exposure mask and developing the upper-layer resist and the lower-layer resist so as to form predetermined resist patterns on the respective upper-layer resist and lower-layer resist;

a resist baking step of applying thermal crosslinking to the upper-layer resist and, at the same time, softening the lower-layer resist so as to enhance adhesion property thereof with the stacked film;

a metal film patterning step of removing the metal film which is exposed from the pattern of the lower-layer resist;

a non-metal multi-layered film patterning step of removing the non-metal multi-layered film which is exposed from the pattern of the lower-layer resist;

a lower-layer resist patterning step of removing the lower-layer resist with the pattern of the upper-layer resist by oxygen ashing;

a channel portion metal film removing step of removing the metal film in a channel portion of the thin film transistor with the pattern of the lower-layer resist thus forming a source electrode and a drain electrode which are separated from each other; and an $n^+$ a-Si film patterning step of removing a contact film which is exposed in the channel portion metal film removing step.

2. A manufacturing method of a display device according to claim 1, wherein the metal film patterning step and the channel portion metal film removing step are constituted of a wet etching step.

3. A manufacturing method of a display device according to claim 1, wherein the non-metal multi-layered film patterning step and the $n^+$ a-Si film patterning step are constituted of a dry etching step.

4. A manufacturing method of a display device comprising:

a stacked film forming step of forming a stacked film which is a thin film transistor constituting material on an insulating substrate, wherein the stacked film is formed by forming a non-metal multi-layered film by stacking a silicon nitride film which constitutes an insulating layer, an a-Si film which constitutes an activation layer and an $n^+$ a-Si film which constitutes a contact layer in order on the insulating substrate and by stacking a metal film which becomes source and drain electrodes on the non-metal multi-layered film;

a two-layered resist transfer step of transferring a film-like two-layered resist onto the stacked film, the film-like two-layered resist having a five-layered structure which is formed by stacking a cushion layer, an upper-layer resist and a lower-layer resist on a base film in this order and forming a cover film on a topmost surface of the lower-layer resist and sets sensitivity of the upper-layer resist thereof higher than sensitivity of the lower-layer resist;

a first patterning step of forming a desired pattern by patterning one resist of the two-layered resist by a direct drawing method;

a second patterning step of forming a desired pattern by patterning another resist of the two-layered resist using an exposure mask;

a resist baking step of applying thermal crosslinking to the upper-layer resist and, at the same time, and softening the lower-layer resist so as to enhance adhesion property thereof with the stacked film;

a metal film patterning step of removing the metal film which is exposed from the pattern of the lower-layer resist;

a non-metal multi-layered film patterning step of removing the non-metal multi-layered film which is exposed from the pattern of the lower-layer resist;

a lower-layer resist patterning step of removing the lower-layer resist with the pattern of the upper-layer resist by oxygen ashing;

a channel portion metal film removing step of removing the metal film in a channel portion of the thin film transistor with the pattern of the lower-layer resist thus forming a source electrode and a drain electrode which are separated from each other; and an $n^+$ a-Si film patterning step of removing a contact film which is exposed in the channel portion metal film removing step.

5. A manufacturing method of a display device according to claim 4, wherein the metal film patterning step and the channel portion metal film removing step are constituted of a wet etching step.

6. A manufacturing method of a display device according to claim 4, wherein the non-metal multi-layered film patterning step and the $n^+$ a-Si film patterning step are constituted of a dry etching step.

* * * * *